US007795975B2

(12) United States Patent
Lin et al.

(10) Patent No.: US 7,795,975 B2
(45) Date of Patent: Sep. 14, 2010

(54) CLASS AB AMPLIFIER

(75) Inventors: Yu-Hsin Lin, Taipei (TW); Hsueh-Kun Liao, Hsin-Chu Hsien (TW)

(73) Assignee: Mediatek Inc., Hsin-Chu (TW)

( * ) Notice: Subject to any disclaimer, the term of this patent is extended or adjusted under 35 U.S.C. 154(b) by 29 days.

(21) Appl. No.: 12/038,122

(22) Filed: Feb. 27, 2008

(65) Prior Publication Data
US 2009/0212866 A1 Aug. 27, 2009

(51) Int. Cl.
*H03F 3/45* (2006.01)
(52) U.S. Cl. ....................................... 330/255
(58) Field of Classification Search ................. 330/255, 330/253
See application file for complete search history.

(56) References Cited

U.S. PATENT DOCUMENTS

| 5,497,122 A * | 3/1996 | Somayajula ................. 330/253 |
| 6,163,217 A * | 12/2000 | Matsubara et al. ........... 330/255 |
| 6,384,685 B1 * | 5/2002 | Juang ........................ 330/264 |

FOREIGN PATENT DOCUMENTS

CN 1684181 10/2005

OTHER PUBLICATIONS

English language translation of abstract of CN 1684181 (published Oct. 19, 2005).

* cited by examiner

*Primary Examiner*—Robert Pascal
*Assistant Examiner*—Khiem D Nguyen
(74) *Attorney, Agent, or Firm*—Thomas, Kayden, Horstemeyer & Risley

(57) ABSTRACT

An amplifier is disclosed. An input transistor receives an input voltage. An impedance unit is coupled to a first electrode of the input transistor. A current source is coupled to a second electrode of the input transistor. A push-pull output circuit comprises a PMOS transistor and a NMOS transistor electrically connected in series to output an output voltage. The first electrode of the input transistor is coupled to a control terminal of the NMOS transistor. A level shifting unit is coupled between the first electrode of the input transistor and the push-pull output circuit, for shifting a voltage of the first electrode of the input transistor and providing a shifted voltage corresponding to the voltage of the first electrode of the input transistor to the control terminal of the PMOS transistor.

22 Claims, 3 Drawing Sheets

CLASS AB AMPLIFIER

BACKGROUND OF THE INVENTION

1. Field of the Invention

The invention relates to an amplifier, and more particularly to a class AB amplifier.

2. Description of the Related Art

Power amplifiers comprise class A amplifiers, class B amplifiers, class C amplifiers, and class AB amplifiers according to different work points. Class A amplifiers comprise the best signal transmission property (the waveform is not distorted). When a class A amplifier does not receive an input signal, current is continuously provided from an output terminal thereof. Thus, a power efficiency range of the class A amplifier is between 20% to 30%. Power efficiency of a class B amplifier can reach 75%. In output waveform output from the class B amplifier, the output waveform is distorted in a positive half cycle or a negative half-cycle. Thus, an input waveform can not be completely amplified.

A class AB amplifier benefits from the advantages of the class A amplifier and the class B amplifier. Power efficiency of the class AB amplifier exceeds that of the class A amplifier.

BRIEF SUMMARY OF THE INVENTION

Amplifiers are provided. An exemplary embodiment of an amplifier comprises a first input transistor, a first impedance unit, a current source, a first push-pull output circuit, and a first level shifting unit. The first input transistor comprises a first electrode, a second electrode, and a control terminal for receiving a first input voltage. The first impedance unit is coupled to the first electrode of the first input transistor. The current source is coupled to the second electrode of the first input transistor. The first push-pull output circuit comprises a first PMOS transistor and a first NMOS transistor electrically connected in series to output a first output voltage. The first electrode of the first input transistor is coupled to a control terminal of the first NMOS transistor. The first level shifting unit is coupled between the first electrode of the first input transistor and the first push-pull output circuit, for shifting a voltage of the first electrode of the first input transistor and providing a shifted voltage corresponding to the voltage of the first electrode of the first input transistor to the control terminal of the first PMOS transistor.

Another exemplary embodiment of a class AB amplifier comprises an input stage and a cascade common source amplifying stage. The input stage is for receiving an input voltage to generate an intermediate voltage. The cascade common source amplifying stage comprises a PMOS path and an NMOS path cascaded with each other for outputting an output voltage. The cascade common source amplifying stage is arranged to shift the intermediate voltage to provide a first shifted voltage for the PMOS path.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
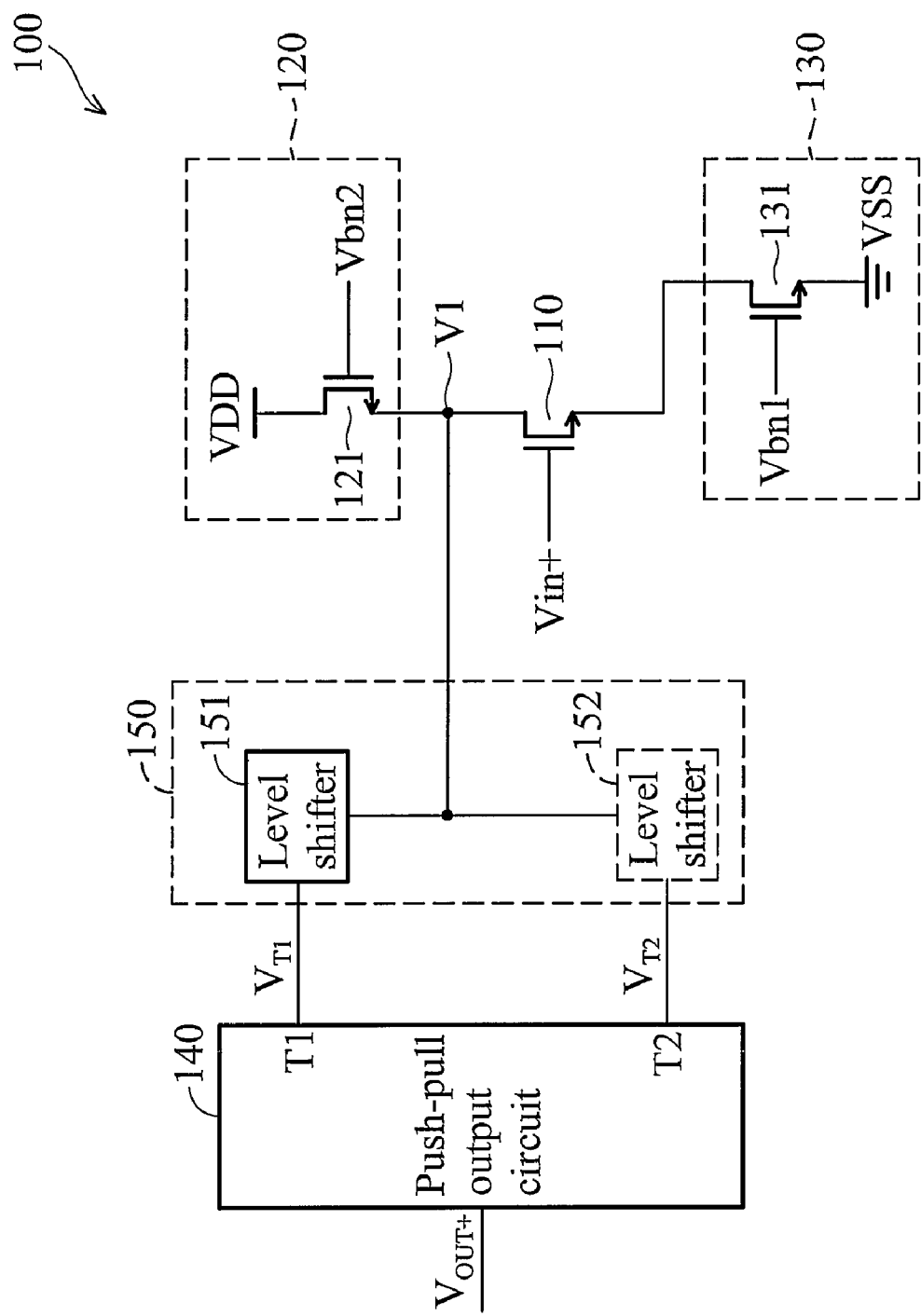
FIG. 1 is a schematic diagram of an exemplary embodiment of an amplifier.

FIG. 1 is a schematic diagram of an exemplary embodiment of an amplifier. The amplifier 100 comprises an input transistor 110, an impedance unit 120, a current source 130, a push-pull output circuit 140, and a level shifting unit 150.

Input transistor 110 receives input voltage Vin+. In this embodiment, input transistor 110 is an NMOS transistor and comprises a gate for receiving input voltage Vin+, a drain is coupled to impedance unit 120 at a node, and a source coupled to current source 130. The voltage of the node refers to the voltage V1, that is, an intermediate voltage generated by the input transistor 110.

Impedance unit 120 is coupled to input transistor 110. In this embodiment, impedance unit 120 is an NMOS transistor 121. NMOS transistor 121 comprises a gate for receiving voltage Vbn2, a drain for receiving voltage VDD (e.g. a supply voltage) and a source coupled to the drain of input transistor 110.

Current source 130 is coupled to input transistor 110. In this embodiment, current source 130 is an NMOS transistor 131. NMOS transistor 131 comprises a gate for receiving voltage Vbn1, a drain coupled to the source of input transistor 110, and a source for receiving voltage VSS (e.g. a ground voltage). The input transistor 110, impedance unit 120 and current source 130 are served as a low gain broadband NMOS load amplifier, i.e. an input stage.

Push-pull output circuit 140 comprises control terminals T1 and T2 and outputs an output voltage $V_{OUT+}$. The voltage of the control terminal T1 refers to voltage $V_{T1}$. The voltage of the control terminal T2 refers to voltage $V_{T2}$. Level shifting unit 150 is coupled between input transistor 110 and push-pull output circuit 140. Level shifting unit 150 shifts the voltage V1 and provides a shifted voltage corresponding to the voltage V1 to push-pull output circuit 140. Push-pull output circuit 140 outputs an output voltage $V_{OUT+}$ according to the shifted voltage. Push-pull output circuit 140 and level shifting unit 150 are served as a high gain cascade common source amplifier, i.e. a cascade common source amplifying stage. In one embodiment, level shifting unit 150 comprises one level shifter 151 for shifting the voltage V1 and providing the shifted result, e.g. the shifted voltage $V_{T1}$ to the control terminal T1 of push-pull output circuit 140. In some embodiments, level shifting unit 150 comprises two level shifters 151 and 152 for providing the corresponding shifted voltage $V_{T1}$ and $V_{T2}$ to control terminals T1 and T2, respectively. Level shifter 151 is coupled between control terminal T1 and the node of voltage V1, e.g. the drain of input transistor 110. Level shifter 152 is coupled between control terminal T2 and the node of voltage V1, e.g. the drain of input transistor 110. When level shifter 151 operates, the voltage $V_{T1}$ of control terminal T1 may be higher than the voltage V1. When level shifter 152 operates, the voltage $V_{T2}$ of control terminal T2 may be lower than the voltage V1.

Figure 2B:
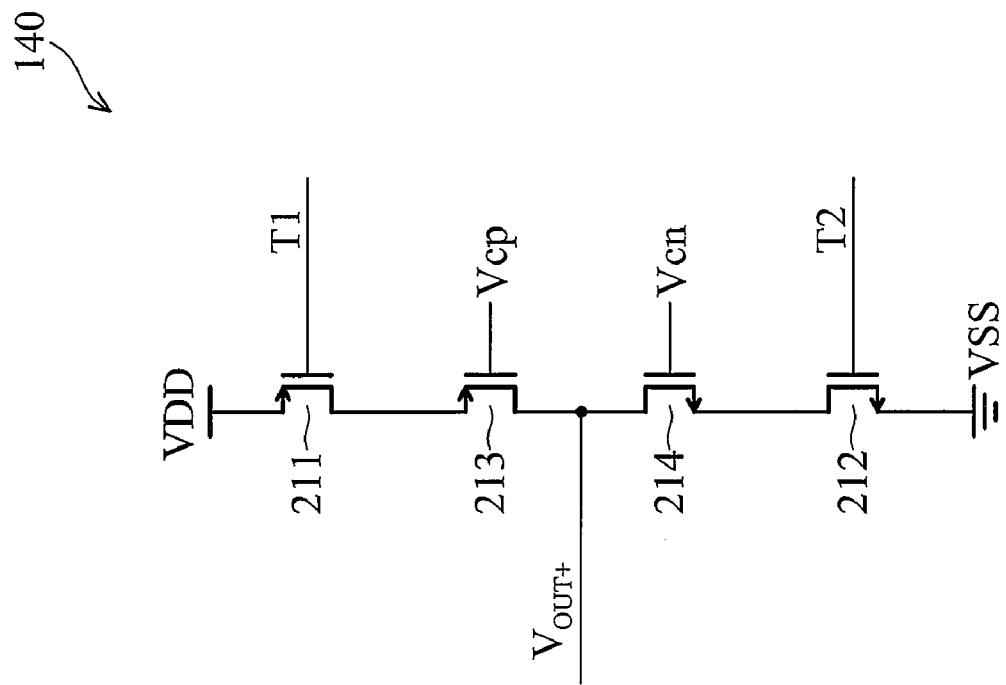
FIG. 2b is a schematic diagram of another exemplary embodiment of the push-pull output circuit.
Figure 2A:
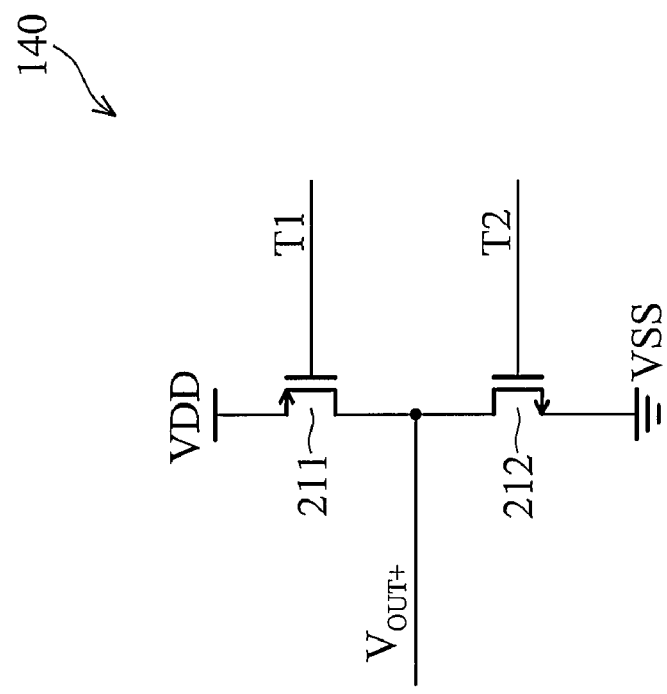
FIG. 2a is a schematic diagram of an exemplary embodiment of the push-pull output circuit.

FIG. 2a is a schematic diagram of an exemplary embodiment of the push-pull output circuit. Push-pull output circuit 140 comprises a PMOS path and an NMOS path, for example, a PMOS transistor 211 and an NMOS transistor 212, respectively. PMOS transistor 211 is connected with NMOS transistor 212 in series to output the output voltage $V_{OUT+}$, for example, at a node disposed between their drains.

PMOS transistor 211 comprises a gate served as control terminal T1, a drain coupled to NMOS transistor 212, a source for receiving voltage, e.g. supply voltage VDD. NMOS transistor 212 comprises a gate served as control terminal T2, a drain coupled to PMOS transistor 211, and a source for receiving voltage, e.g. ground voltage VSS. PMOS transistor 211 and NMOS transistor 212 are generally operated in saturation region with the voltages of terminals T1 and T2.

The operation of the amplifier 100 is described in detail with reference to FIGS. 1 and 2a. Firstly, assuming level shifting unit 150 only comprises level shifter 151 for providing the shifted voltage $V_{T1}$ to the control terminal T1, and the control terminal T2 receives the voltage V1. When input voltage Vin+ increases, the voltage V1 is reduced such that the shifted voltage $V_{T1}$ is also reduced accordingly. Referring to FIG. 2a, when the shifted voltage $V_{T1}$ is reduced, the voltage difference between the voltage VDD and the shifted voltage $V_{T1}$ is increased. Thus, the current passing through PMOS transistor 211 is increased. Since the voltage V1 is reduced, the voltage $V_{T2}$ is also reduced such that the current passing through NMOS transistor 212 is reduced. Thus, the output voltage $V_{OUT+}$ is increased because of the increased current passing through PMOS transistor 211 and the reduced current passing through NMOS transistor 212.

FIG. 2b is a schematic diagram of another exemplary embodiment of the push-pull output circuit. FIG. 2b is similar to FIG. 2a with the exception that push-pull output circuit shown in FIG. 2b further comprises a PMOS transistor 213 and an NMOS transistor 214. PMOS transistor 213 is electrically connected with NMOS transistor 214 in series between PMOS transistor 211 and NMOS transistor 212.

PMOS transistor 213 comprises a gate for receiving a bias voltage Vcp, a drain coupled to NMOS transistor 214, and a source coupled to the PMOS transistor 211. NMOS transistor 214 comprises a gate for receiving a bias voltage Vcn, a drain coupled to PMOS transistor 213 and a source coupled to NMOS transistor 212. PMOS transistor 213 and NMOS transistor 214 are generally operated in saturation region with bias voltages Vcp and Vcn, respectively.

Figure 3:
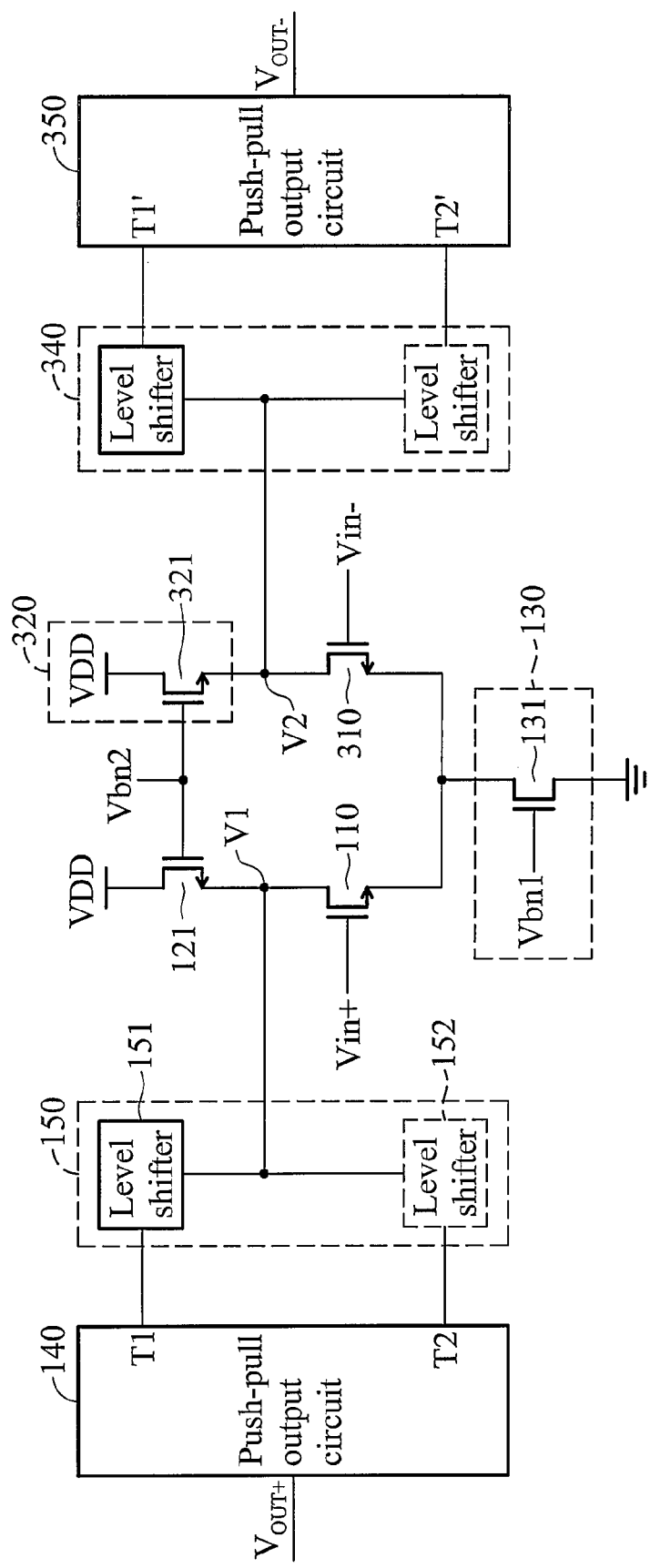
FIG. 3 is a schematic diagram of another exemplary embodiment of an amplifier.

FIG. 3 is a schematic diagram of another exemplary embodiment of an amplifier. FIG. 3 is similar to FIG. 1 with the exception that the amplifier shown in FIG. 3 further comprises an input transistor 310, an impedance unit 320, a level shifting unit 340, and a push-pull output circuit 350. That is, the amplifier shown in FIG. 3 has two inputs for receiving input voltages Vin+ and Vin−, and generates two output voltages Vout+ and Vout−, for example, a pair of differential output voltages.

Input transistor 310 receives input voltage Vin− and is coupling to current source 130. Impedance unit 320 is coupled to input transistor 310. Push-pull output circuit 350 comprising control terminals T1' and T2'. The structure of push-pull output circuit 350 may be the same as push-pull output circuit 140 shown in FIGS. 2a or 2b. The control terminals T1 and T2 shown in FIG. 2a can be served control terminals T1' and T2'. Level shifting unit 340 is coupled between input transistor 310 and push-pull output circuit 350.

Since the operations of input transistor 310, impedance unit 320, level shifting unit 340, and push-pull output circuit 350 are similar to operations of input transistor 110, impedance unit 120, push-pull output circuit 140, and level shifting unit 150, descriptions of input transistor 310, impedance unit 320, push-pull output circuit 340, and level shifting unit 350 are omitted.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
    a first input transistor having a first electrode, a second electrode, and a control terminal for receiving a first input voltage;
    a first impedance unit coupled to the first electrode of the first input transistor;
    a current source coupled to the second electrode of the first input transistor;
    a first push-pull output circuit comprising a first PMOS transistor and a first NMOS transistor electrically connected in series to output a first output voltage, wherein the first electrode of the first input transistor is coupled to a control terminal of the first NMOS transistor;
    a first level shifting unit coupled between the first electrode of the first input transistor and the first push-pull output circuit, for shifting a voltage of the first electrode of the first input transistor and providing a first shifted voltage corresponding to the voltage of the first electrode of the first input transistor to a control terminal of the first PMOS transistor;
    a second input transistor having a first electrode, a second electrode coupled to the current source, and a control terminal for receiving a second input voltage;
    a second impedance unit coupled to the first electrode of the second transistor;
    a second push-pull output circuit comprising a second PMOS transistor and a second NMOS transistor electrically connected in series to output a second output voltage, wherein the first electrode of the second input transistor is coupled to a control terminal of the second NMOS transistor; and
    a second level shifting unit coupled between the first electrode of the second input transistor and the second push-pull output circuit, for shifting a voltage of the first electrode of the second input transistor and providing a second shifted voltage corresponding to the voltage of the first electrode of the second input transistor to a control terminal of the second PMOS transistor, wherein a voltage of the control terminal of the first NMOS transistor is substantially equal to the voltage of the first electrode of the first input transistor.

2. The amplifier as claimed in claim 1, wherein the first level shifting unit is arranged to provide a third shifted voltage corresponding to the voltage of the first electrode of the first input transistor to the control terminal of the first NMOS transistor.

3. The amplifier as claimed in claim 2, wherein the first level shifting unit comprises two level shifters for providing the corresponding shifted voltages to the control terminals of the first PMOS transistor and the first NMOS transistor, respectively.

4. The amplifier as claimed in claim 1, wherein the first impedance unit comprises an NMOS transistor having a drain coupled to a supply voltage and a source coupled to the first electrode of the first input transistor, the current source comprises another NMOS transistor having a drain coupled to the second electrode of the first input transistor and a source coupled to a ground voltage, and the first input transistor is NMOS transistor.

5. The amplifier as claimed in claim 1, wherein the first push-pull output circuit further comprises at least one PMOS transistor and at least one NMOS transistor electrically connected between the first PMOS transistor and the first NMOS transistor.

6. The amplifier as claimed in claim 1, wherein the transistors of the first push-pull output circuit are operated in saturation region.

7. The amplifier as claimed in claim 1, wherein the second level shifting unit is arranged to provide a third shifted voltage corresponding to the voltage of the first electrode of the second input transistor to the control terminal of the second NMOS transistor.

8. The amplifier as claimed in claim 7, wherein the second level shifting unit comprises two level shifters for providing the corresponding shifted voltages to the control terminals of the second PMOS transistor and the second NMOS transistor, respectively.

9. The amplifier as claimed in claim 1, wherein the second impedance unit comprises an NMOS transistor having a drain coupled to a supply voltage and a source coupled to the first electrode of the second input transistor, and the current source comprises another NMOS transistor having a drain coupled to the second electrode of the second input transistor and a source coupled to a ground voltage, and the second input transistor is NMOS transistor.

10. The amplifier as claimed in claim 1, wherein the second push-pull output circuit further comprises at least one PMOS transistor and at least one NMOS transistor electrically connected between the second PMOS transistor and the second NMOS transistor.

11. The amplifier as claimed in claim 1, wherein the transistors of the second push-pull output circuit are operated in saturation region.

12. A class AB amplifier, comprising:
an input stage for receiving a first input voltage to generate a first intermediate voltage and receiving a second input voltage to generate a second intermediate voltage;
a first cascade common source amplifying stage comprising a first MOS path and a second MOS path cascaded with each other for outputting a first output voltage, wherein the first cascade common source amplifying stage is arranged to shift the first intermediate voltage to provide a first shifted voltage for the first MOS path; and
a second cascade common source amplifying stage comprising a third MOS path and a fourth MOS path cascaded with each other for outputting a second output voltage, wherein the second cascade common source amplifying stage is arranged to shift the second intermediate voltage to provide a second shifted voltage for the third MOS path, wherein the second MOS path continuously transmits a voltage and the voltage is substantially equal to the first intermediate voltage.

13. The class AB amplifier as claimed in claim 12, wherein the first cascade common source amplifying stage is further arranged to provide a third shifted voltage for the second MOS path.

14. The class AB amplifier as claimed in claim 12, wherein the first MOS path comprises a PMOS transistor and the second MOS path comprises an MOS transistor, and the first output voltage is generated at a node between drains of the MOS and MOS transistors.

15. The class AB amplifier as claimed in claim 12, wherein the input stage comprises:
an input transistor having a control terminal for receiving the first input voltage, a first electrode for generating the first intermediate voltage, and a second electrode;
an impedance unit coupled to the first electrode of the input transistor; and
a current source coupled to the second electrode of the input transistor; and
the first cascade common source amplifying stage comprises:
a push-pull output circuit comprising the first MOS path and the second MOS path for outputting the first output voltage; and
a level shifting unit for shifting the first intermediate voltage and providing the first shifted voltage to a control terminal of the first MOS path.

16. The class AB amplifier as claimed in claim 15, wherein the level shifting unit is further for providing a third shifted voltage to a control terminal of the second MOS path.

17. The class AB amplifier as claimed in claim 16, wherein the level shifting unit comprises two level shifters for providing the corresponding shifted voltages to the control terminals of the first MOS path and the second MOS path, respectively.

18. The class AB amplifier as claimed in claim 15, wherein the push-pull output circuit further comprises at least one PMOS transistor and at least one NMOS transistor electrically connected in series between the first MOS path and the second MOS path.

19. The class AB amplifier as claimed in claim 15, wherein the transistors of the push-pull output circuit are operated in saturation region.

20. The class AB amplifier as claimed in claim 15, wherein the second MOS path comprises an NMOS transistor when the input transistor is an NMOS transistor; or the second MOS path comprises a PMOS transistor when the input transistor is a PMOS transistor.

21. The class AB amplifier as claimed in claim 12, wherein the first MOS path comprises an NMOS transistor and the second MOS path comprises a PMOS transistor, and the first output voltage is generated at a node between drains of the PMOS and NMOS transistors.

22. An amplifier, comprising:
a first input transistor having a first electrode, a second electrode, and a control terminal for receiving a first input voltage;
a first impedance unit coupled to the first electrode of the first input transistor;
a current source coupled to the second electrode of the first input transistor;
a first push-pull output circuit comprising a first PMOS transistor and a first NMOS transistor electrically connected in series to output a first output voltage, wherein the first electrode of the first input transistor is coupled to a control terminal of the first NMOS transistor;
a first level shifting unit coupled between the first electrode of the first input transistor and the first push-pull output circuit, for shifting a voltage of the first electrode of the first input transistor and providing a first shifted voltage corresponding to the voltage of the first electrode of the first input transistor to a control terminal of the first PMOS transistor
a second input transistor having a first electrode, a second electrode coupled to the current source, and a control terminal for receiving a second input voltage; and a second impedance unit coupled to the first electrode of the second transistor;

a second push-pull output circuit coupled to the second input transistor, wherein a voltage of the control terminal of the first NMOS transistor is substantially equal to the voltage of the first electrode of the first input transistor.

* * * * *